United States Patent
Ding et al.

(10) Patent No.: US 10,834,504 B2
(45) Date of Patent: Nov. 10, 2020

(54) TEMPERATURE DETECTING AND CONTROLLING INTEGRATION DEVICE AND THE TEMPERATURE CONTROLLING METHOD APPLIED FOR MICRO SPEAKER

(71) Applicant: Xiamen Fourier Electronics Co., Ltd., Xiamen (CN)

(72) Inventors: Xuexin Ding, Shanghai (CN); Weiji Liu, Shanghai (CN); Jian Xu, Shanghai (CN); Lin Zhang, Shanghai (CN); Xiaolei Liu, Shanghai (CN); Yingshun Jiang, Shanghai (CN); Fangkang Shen, Shanghai (CN)

(73) Assignee: XIAMEN FOURIER ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/682,454

(22) Filed: Nov. 13, 2019

(65) Prior Publication Data
US 2020/0084542 A1 Mar. 12, 2020

Related U.S. Application Data

(63) Continuation of application No. 16/119,838, filed on Aug. 31, 2018, now Pat. No. 10,531,193.

(30) Foreign Application Priority Data

Nov. 1, 2017 (CN) .......................... 2017 1 1059595
Nov. 6, 2017 (CN) ............................ 2017 1 108066
May 22, 2018 (CN) .......................... 2018 1 0492803

(51) Int. Cl.
*H04R 3/00* (2006.01)
*H03F 3/24* (2006.01)
(Continued)

(52) U.S. Cl.
CPC ............. *H04R 3/007* (2013.01); *H03F 3/183* (2013.01); *H03F 3/245* (2013.01);
(Continued)

(58) Field of Classification Search
CPC ........ H04R 3/007; H04R 3/04; H04R 29/001; H04R 29/003; H03F 3/183; H03F 3/245;
(Continued)

(56) References Cited

U.S. PATENT DOCUMENTS

2014/0254805 A1 9/2014 Su et al.
2015/0124982 A1* 5/2015 Berthelsen ........... H04R 29/001
381/59

(Continued)

*Primary Examiner* — Norman Yu
(74) *Attorney, Agent, or Firm* — Muncy, Geissler, Olds & Lowe, P.C.

(57) ABSTRACT

A temperature detecting and controlling integration device for the micro speaker is provided. After the filter receives an input signal, the power amplifier adjusts the power amplification, and the multi-frequency detection signal is generated with the waveform generator. The extracted signal is generated to drive the micro speaker to emit a sound signal. Afterwards, the voltage signals are extracted at two ends of the coil and the temperature signal is obtained by converting, capturing, and integrating to pass the temperature value to the external device, and the temperature value of the non-linear temperature-controlling unit is analyzed to adjust the compensation gain in real time. The smoothly control of speaker temperature and stable playback of the sound signals is played that can be achieved.

12 Claims, 9 Drawing Sheets

(51) Int. Cl.
*H03F 3/183* (2006.01)
*H03G 3/30* (2006.01)
*H04R 29/00* (2006.01)
*H04R 3/04* (2006.01)
*H03G 7/08* (2006.01)
*H03G 7/00* (2006.01)

(52) U.S. Cl.
CPC ........... *H03G 3/3005* (2013.01); *H03G 7/002* (2013.01); *H03G 7/08* (2013.01); *H04R 3/04* (2013.01); *H04R 29/001* (2013.01); *H04R 29/003* (2013.01); *H03F 2200/03* (2013.01); *H03F 2200/165* (2013.01); *H03G 2201/103* (2013.01)

(58) Field of Classification Search
CPC .......... H03F 2200/03; H03F 2200/165; H03G 7/002; H03G 7/08; H03G 3/3005; H03G 2201/103
USPC ..... 381/106, 59, 55, 104, 108, 58, 120, 164, 381/71.11
See application file for complete search history.

(56) References Cited

U.S. PATENT DOCUMENTS

| | | | |
|---|---|---|---|
| 2017/0105068 A1 | 4/2017 | Lesso | |
| 2017/0347190 A1* | 11/2017 | Thyssen | ................... H04R 9/06 |
| 2018/0136899 A1* | 5/2018 | Risberg | .................. H04R 3/002 |
| 2018/0352329 A1* | 12/2018 | Klingler | .................. G06F 1/325 |

\* cited by examiner

TEMPERATURE DETECTING AND CONTROLLING INTEGRATION DEVICE AND THE TEMPERATURE CONTROLLING METHOD APPLIED FOR MICRO SPEAKER

CROSS-REFERENCE TO RELATED APPLICATIONS

This application is a continuation application of U.S. patent application Ser. No. 16/119,838 entitled "Temperature detecting and controlling integration device and the temperature controlling method applied for micro speaker" filed on Aug. 31, 2018, which claims priority to China Patent Application No. 201711059595.8, filed on Nov. 1, 2017, China Patent Application No. 201711080667.7, filed on Nov. 6, 2017, and China Patent Application No. 201810492803.1, filed on May 22, 2018, the content of which are hereby incorporated by reference in their entirety.

1. FIELD OF THE INVENTION

The present invention related to a temperature detecting and controlling integration device for a micro speaker, and more particularly to a temperature controlling method by using an integrated circuit to detect the temperature and adjust the compensation gain for the micro speaker.

2. DESCRIPTION OF THE PRIOR ART

The micro speaker is usually a speaker that is set in a portable device and the volume is within 15 mm*15 mm in size, and has an output power of less than 2 watts. The micro speaker can applied for the electronic products, such as mobile phone, notebook, or personal digital assistant (PDA). Please refer to FIG. 1. FIG. 1 is illustrating a conventional micro speaker. The micro speaker S is composed of a coil 100, a magnet 200, a speaker 300 and diaphragm 400. It is note to illustrate that the card-type coordinate system is used in FIG. 1, X axis, Y axis, and Z axis are shown in FIG. 1 respectively. The origin of the coordinate axis is positioned at a corner of the micro speaker S to locate easily. The diaphragm 400 and the coil 100 are formed a flexible suspension system. After the coil 100 is energized, the diaphragm 400 is reciprocated in Y direction (also called vibration in resonance) under the magnetic field of the magnet 200, so that the air is urged by the reciprocation of the diaphragm 400 to vibrate and making a sound.

The working principle for the micro speaker S is to convert the electric energy into the acoustic energy. Nevertheless, during the energy conversion, some of the energy of the micro speaker S will dissipate in the form of heat due to the internal impedance of the coil 100. If the heat cannot dissipate out of the micro speaker S, it would cause that the micro speaker S is under the elevated temperature environment. In the configuration of the micro speaker S, the coil 100 is attached the diaphragm 400. When the heat is generated by the coil 100, the heat is transferred from the coil 100 to the diaphragm 400, so that the heat will increase the temperature of the diaphragm 400, and the diaphragm 400 will be damaged or deformed due to the elevated temperature. Based on the aforementioned, the distortion of the output waveform of the micro speaker S is to be generated or the micro speaker S is permanently to be damaged. At the same time, the overheating of the coil 100 can also result in permanent damage of the magnet 200.

Accordingly, the coil temperature of the micro speaker S needs to be monitored during the operation of the micro speaker S.

The prior art mentions a coil temperature control method in a micro speaker S. In the prior art not only disclosed the temperature controlling method for the coil but also disclosed the temperature monitoring method. The resistor network is coupled with the micro speaker S in parallel form. Because the micro speaker S has different resistances at difference temperatures, the changes in the resistance of the micro speaker S will cause that the resistor network outputs the different voltages. Next, the different voltages outputted from the resistor network are then transferred to the analog-to-digital converter and temperature estimator. The voltages are converted into the temperatures by the temperature estimator. Accordingly, the coil temperature can be obtained at a certain time. The resistor network can be constructed by Wheatstone bridge or a voltage divider. Although the previous method can only obtain the temperature from the voltage conversion, but the correlation coefficient between the temperature and the voltage is low, and the coefficient of variation is large. Thus, by using the voltage conversion to obtain the temperature is inaccurate. Furthermore, the resistor coupled in parallel on the micro speaker S will introduce the loss of the input current, so that the sound quality restored by the micro speaker S is reduced. Therefore, above technology cannot satisfy the requirements of the users for the music appreciation on the sound quality. Moreover, the prior art did not disclose how the actual voltage is converted into the temperature clearly, so that the authenticity of the temperature value cannot be judged.

In another prior art, a temperature sensing circuit is disclosed. The temperature sensing circuit detects the resistance of the coil of the micro speaker S at a first time and a second time and is cooperated with the temperature coefficient of the voice coil material itself through mathematical operations to obtain the voice coil temperature at a second time. Although the prior art utilizes the resistance to obtain the voice coil temperature to increase the realism of the temperature, but the instantaneous temperature measured by the sensor still contains noise, the noise still cause that the coil temperature is inaccurate. In addition, because the temperature is a long-term variation process, if the temperature is obtained based on the instantaneous physical quantity, the obtained temperature may be inaccurately. Moreover, each measurement resistance will inevitably lead to current loss, so the sound quality of the micro speaker still would be reduced.

In addition, when the micro speaker S is in operation, the conversion efficiency of the electric energy is transduced into acoustic energy is not achieved 100%, so that the heat dissipation would be generated by the coil of the micro speaker S. The heat dissipation will also have conducted to the neighboring driving circuit to cause the internal temperature of the driving circuit of the micro speaker S is increased. Although the driving circuit has already considered the influence of the heat dissipation on it operation stability at the beginning of the design, however, a long-term high operating temperature inevitably introduces to a decrease in the operating life of the driving circuit, and the instantaneous elevated temperature may cause the damage. For example, the power amplification at the power amplifier in the micro speaker is set between 5 dB and 10 dB. Once the operating temperature of the driving circuit fluctuates, the changes in the temperature physical factor exceed the rated range. For example, if the power amplification at the power amplifier in the micro speaker is 12 dB at a certain time, the sound of the micro speaker S is malfunctioned instantaneously, but it will cause the permanent damage to the micro speaker.

SUMMARY OF THE INVENTION

In order to improve the disadvantage of above mentioned, the present invention mainly provides a temperature detecting and controlling integration device is applied for a micro speaker, which can detect the coil temperature within the micro speaker, so that the sound quality of the sound restored by the micro speaker is not to be reduced.

In addition, the temperature detecting and controlling integration device is applied for a micro speaker of the present invention can further control the power amplification of the power amplifier in the micro speaker within a rated range to protect the micro speaker from permanent damage.

It is an objective of the present invention to provide a method for detecting the coil temperature of the micro speaker and a method for controlling the amplification ratio of the power amplifier, by using above methods can accurately detect the coil temperature of the micro speaker and adjust the power amplification of the power amplifier by the driving circuit according to the stored table and the existing data which stored in the temperature detecting and controlling integration device.

According to above objectives, the present invention provides a temperature detecting and controlling integration device coupled with a calculator, which is applied for detecting a coil temperature in a micro speaker. The temperature detecting and controlling integration device includes a filter, a power amplifier, a waveform generator, an adder, an extraction resistor, a micro speaker, a current filter, a voltage filter, a current integrator, a voltage integrator, an arithmetic and logical unit, and a non-linear temperature-controlling unit.

The filter receives an input signal from the computer and filters off a frequency of the input signal to generate an output signal. The power amplifier includes an input terminal coupled with the filter. The power amplifier is provided for amplifying the output signal from the filter according to the power amplification to form an audio signal, so that the audio signal is outputted from an output terminal of the power amplifier.

The waveform generator is provided for generating a marked signal.

The adder includes an input terminal that is coupled with the power amplifier and the waveform generator respectively. The adder is provided for adding the audio signal and the marked signal to form an adding signal, and the adding signal is outputted from an output terminal of the adder.

The extraction resistor includes an input terminal that is coupled with the output terminal of the adder, and the extraction resistor receives the adding signal and extracts the current within the adding signal to form an extracted current signal.

The micro speaker includes an input terminal that is coupled with the output terminal of the extraction resistor. The micro speaker receives the extracted current signal to form a coil thermal voltage signal and outputs a sound signal.

The current filter includes an input terminal that is coupled with the output terminal of the extraction resistor. The current filter filters off a second frequency within the extracted current signal to form a filtered current signal. Next, the filtered current signal is outputted from the output terminal of the current filter.

The voltage filter includes an input terminal for receiving the coil thermal voltage signal to filter off the second frequency within the coil thermal voltage signal to form filtered voltage signal. Then, the filtered voltage signal is outputted from an output terminal of the voltage filter.

The current integrator includes an input terminal that is coupled with the output terminal of the current filter for integrating the filtered voltage signal to form a current-integrated signal. Then, the current-integrated signal is outputted from an output terminal of the current integrator.

The voltage integrator includes an input terminal that is coupled with the output terminal of the voltage filter. The voltage integrator integrates the filtered voltage signal to form a voltage-integrated signal. Then, the voltage-integrated signal is outputted from an output terminal of the voltage integrator.

The arithmetic and logical unit is coupled with the output terminal of the voltage integrator and the current integrator respectively. The arithmetic and logical unit receives and calculates the current-integrated signal and the voltage-integrated signal to generate a resistance signal.

The non-linear temperature-controlling unit receives and calculates a temperature signal to obtain a compensation gain, and the compensation gain is then transferred to the power amplifier to dynamically adjust the power amplification. Thereby, an amplitude of the sound signal can be suppressed before the sound signal is outputted from the power amplifier.

In addition, the present invention also provides a method for detecting a coil temperature within a micro speaker, The method includes an input signal is provided from a computer, a first frequency within the input signal is filtered off by a filter to form an output signal, an amplitude of the output signal is adjusted according to a compensation gain to form a sound signal, a marked signal and the sound signal are added to form a adding signal by an adder, a current signal and a voltage signal within the adding signal are extracted to form an extracted current signal and an extracted voltage signal respectively by an extraction resistor, the extracted current signal and the extracted voltage signal are converted from an analog to a digital by an analog-to-digital converter, a second frequency within the extracted current signal is filtered off to form a filtered current signal by a current filter, a second frequency within the extracted voltage signal is filtered off to form a filtered voltage signal by a voltage filter, the filtered current signal and the filtered voltage signal are integrated to form a current-integrated signal and a voltage-integrated signal respectively by a integrator and a voltage integrator, and the current-integrated signal and the voltage-integrated signal to form a resistance signal and the resistance signal is processed to form a temperature signal.

Accordingly, the temperature of the micro speaker can be smoothly controlled by the gain value of the amplitude of the sound signal and the sound signals can be playbacked steadily.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
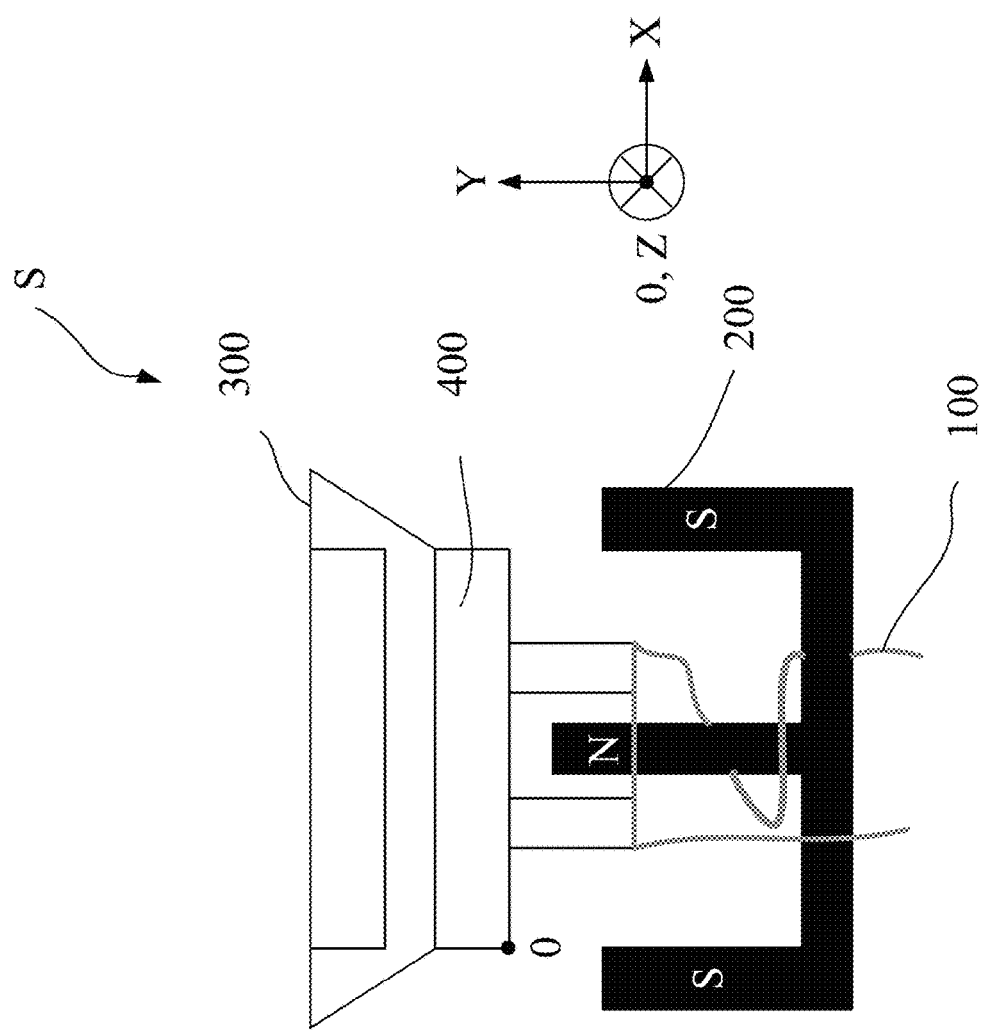
FIG. 1 is a schematic diagram illustrating a micro speaker in accordance with the conventional prior art.
Figure 2:
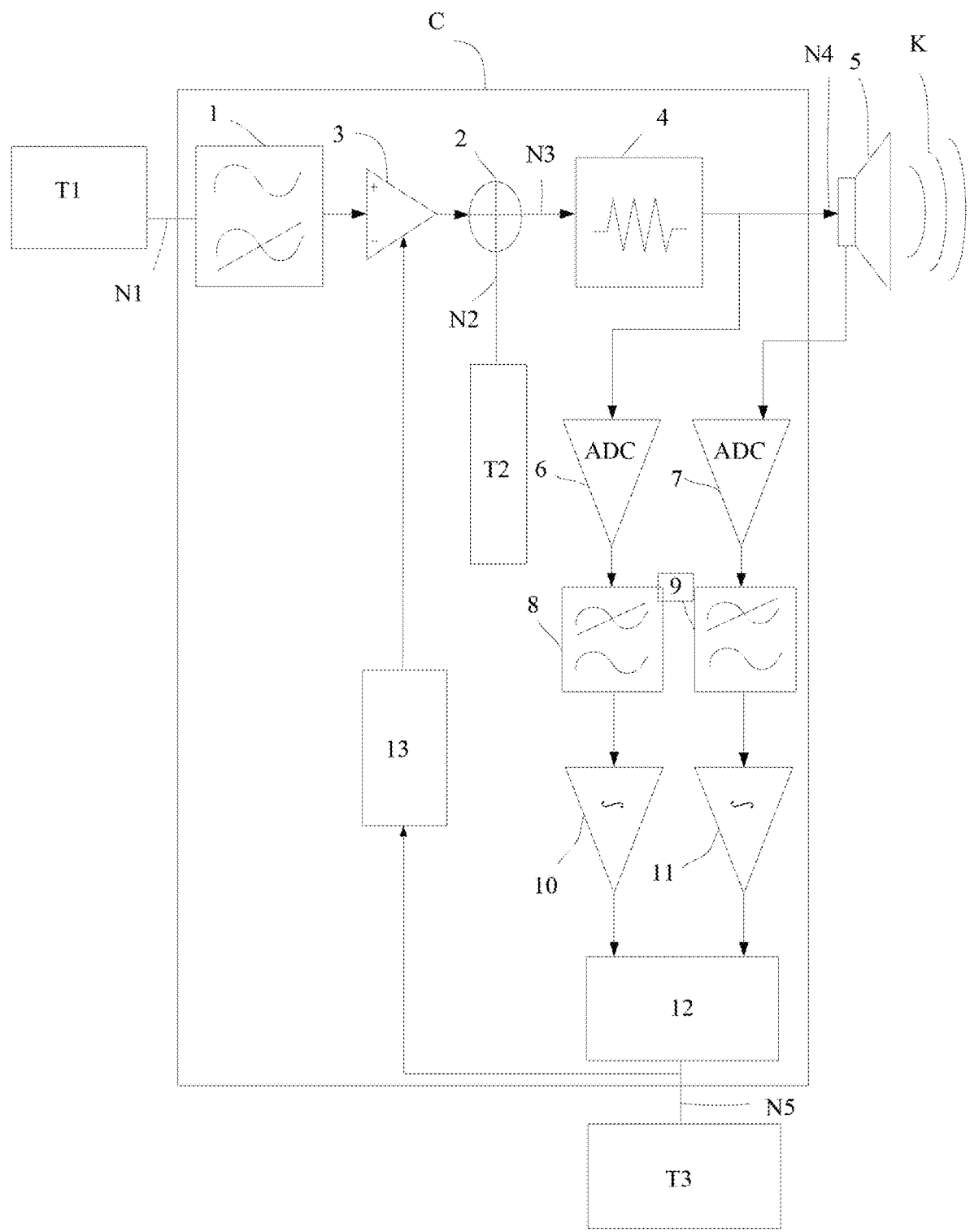
FIG. 2 is a circuit block diagram of a temperature detecting and controlling integration device in accordance with the present invention.

Please refer to FIG. 2. FIG. 2 shows a circuit block diagram of a temperature detecting and controlling integration device. As shown in FIG. 2, the temperature detecting and controlling integration device C is coupled with a computer T1, a micro speaker 5 and an external device T3 respectively. The temperature detecting and controlling integration device C can be a chip with six pins (not shown in FIG. 2), one of six pins of the chip is coupled to the computer T1, a four of six pins of the chip is coupled to the micro speaker 5, or other one of the six chip is coupled to the external device T3. The temperature detecting and controlling integration device C is used for measuring and controlling the temperature of the coil (not shown in FIG. 2) of the micro speaker 5, and is provided for making the micro speaker 5 to emit a sound signal K. In the embodiment of this invention, the computer T1 is a personal computer, a smart phone, or any other devices which can emit the sound signal. The external device T3 is a digital thermometer, a personal computer, or a smart phone. The connection between the computer T1, the external device T3, and the temperature detecting and controlling integration device C may be the way of using a USB standard, I2C bus or a jumper. In addition, the temperature detecting and controlling integration device C is coupled with the micro speaker 5 by I2S bus.

Please continue refer to FIG. 2. The temperature detecting and controlling integration device C includes a filter 1, an adder 2, a power amplifier 3, an extraction resistor 4, an analog-to-digital converters 6, 7, a current filter 8, a voltage filter 9, a current integrator 10, a voltage integrator 11, an arithmetic unit 12, and a non-linear temperature-controlling unit 13. In addition to the extraction resistor 4, other components include an input terminal and an output terminal as a typical electronic component. It should be known by the personal skill in the art; the electronic device receives the physical signal via the input terminal, and outputs the physical signal through the output terminal.

The filter 1 is used for receiving the input signal from the computer T1, and filtering off a first frequency of the input signal to form an output signal. The first frequency is above 0 Hz and not more than 50 Hz. The purpose of filtering off the first frequency is to make a signal generated by the subsequent waveform generator T2 that is not to be disturbed by the noise contained in the input signal transmitted by the computer T1. Most of the noise is hidden within the range of the first frequency. The power amplifier 3 is coupled with the filter 1 that is used for receiving the output signal from the filter 1. The power amplifier 3 adjusts the power amplification A according to the output signal is outputted from the filter 1, and the output signal is amplified to form an audio signal. In this embodiment of the present invention, the power amplifier 3 such as a Class AB power amplifier, and other types such as Class A, Class B, Class C, and Class D power amplifiers or other suitable power amplifiers are applicable to the present invention. The adder 3 is used for receiving the audio signal that is outputted from the power amplifier 3 and a marked signal that is outputted from the waveform generator T2. Then, the adder 3 performs an addition operation for the audio signal and the marked signal to form an adding signal. In this invention, the adder 2 is a full adder. It is to be noted that the addition of the marked signal generated from the waveform generator T2 in subsequent sound signal K and the temperature signal means that the subsequent arithmetic unit 12 has a comparison basis when the temperature signal is calculated. The marked signal may be a signal with or multiple-frequency composites and the range of the frequency is less than 50 Hz. The waveform generator T2 is a CLK generator. In should be noted that the signal such as marked signal is generated by the waveform generator T2 may still mixed with the noise of the first frequency.

Please continue refer to FIG. 2. The extraction resistor 4 receives the audio signal and extracts the current signal within the audio signal to form an extracted signal. The function of the extraction resistor 4 is to extract some of the physical components in the adding signal for subsequent calculation to form a temperature signal or to play the sounds. The resistance of the extraction resistor 4 is in a range from 50-200 milliohms, the preferable is in a range from 50-100 mill ohms. The micro speaker 5 plays the sound after the sound signal K is received. However, in the micro speaker 5, part of the electrical energy and the kinetic energy will be consumed in the coil (not shown in FIG. 2) when the electrical energy and the kinetic energy are transmitted to the micro speaker 5, so that the coil will heat up, and the voltage signal and the current signal is change, too. Accordingly, the conversion efficiency of the kinetic energy and the electronic energy of the micro speaker 5 cannot achieved 100%. In addition, the extracted signal includes the component(s) of the original marked signal.

Please continue refer to FIG. 2. The current filter 8 is used for filtering off the second frequency within the extracted signal to form a filtered current signal. The voltage filter 9 is used for filtering off the second frequency within the coil thermal voltage signal to form a filtered voltage signal. The range of the second frequency is in a range from 50 Hz-20,000 Hz. The current filter 8 and the voltage filter 9 can filter off the second frequency within the extracted signal and the coil thermal voltage signal to keep the first frequency for detecting the temperature accurately. In this embodiment, the range of the remaining first frequency is above 0 Hz and is not more than 50 Hz. The current integrator 10 is used for integrating the filtered voltage signal and outputting a voltage-integrated signal. Due to the changes in temperature is a slow process, the filtered current signal and the voltage signal are integrated by the current integrator 10 and the voltage integrator 11 at a certain time to obtain the current signal or voltage signal in a slow change. To compare with the traditional way to obtain the current signal or voltage signal at a certain time, the above method is more stable. It is especially to that when the multi-frequency composite signal is used as a marked signal, the anti-interference capability of the temperature detecting can be enhanced. The voltage integrator 11 and the current integrator 10 are implemented by using a multi-stage filter with a bandwidth of about 50 Hz to obtain the result of the filtered current signal and the filtered voltage signal based on the time integration calculation. At this time, the range of integration is usually a specific time range. If the time taken to start reception of the signal generated by the computer T1 by the filter 1 in the temperature detecting and controlling integration device C is set to 0 second, the time range is usually between 1-10 seconds. The user can adjust the filtering parameters of the voltage integrator 11 and the current integrator 10 to obtain the desired integration time range.

Please refer to FIG. 2. The arithmetic unit 12 receives the current-integrated signal and the voltage-integrated signal, and transmits the temperature signal to the external device T3, in which the external device T3, for example, an electronic device capable of displaying a temperature value, such as electronic thermometer. Specifically, the arithmetic unit 12 further divides the received current-integrated signal and the received voltage-integrated signal to generate a resistance signal. Next, the arithmetic unit 12 processes the resistance signals to obtain a temperature signal according to the formula (1) as following:

$$T = 25 + \frac{R_T - R_{25}}{T_{coef} \cdot R_{25}}, \qquad (1)$$

in which T is a coil temperature, $R_T$ is coil impedance measured at this coil temperature T, $R_{25}$ is coil impedance at 25 degree Celsius, $T_{coef}$ is coil temperature coefficient at this coil temperature T. $R_{25}$ and $T_{coef}$ are contained in the marked signal. $R_T$ is converted by the coil thermal voltage signal. Accordingly, after the process of formula (1), the resistance signal is converted into the temperature signal (i.e., the coil temperature in the above formula (1)) to determine the coil temperature. Next, the arithmetic unit 12 transmits the temperature signal to the external device T3 to display the temperature, so that the temperature signal is converted into a human-readable signal for the user to refer to.

On the other hand, the temperature signal is also transmitted to the non-linear temperature-controlling unit 13 for calculating to obtain the compensation gain (hereinafter abbreviated as ΔG), and the compensation gain is transmitted to the power amplifier 3 to control the power amplifier 3 at different times and different temperatures, it can be shown as ΔG (t, T), and the unit of compensation gain ΔG is decibel (dB). Actually, the power amplification Ap of the power amplifier 3 is related to the time t and the current temperature T of the temperature detecting and controlling integration device C, it can be shown as $A_p$ (T, t), the unit of power amplification $A_p$ is dB. In addition, the mathematical relationship between the power amplification rate $A_p$ and the compensation gain ΔG is shown as the formula (2) as following:

$$A_p(T,t) = A_p(20,0) + \Delta G(T,t) \qquad (2)$$

According to formula (2), when t=0, that is, the non-linear temperature-controlling unit 13 is not activated, the value of ΔG is 0, and the value of the power amplification $A_p$ is $A_p$ (20, 0). The power amplification $A_p$ (20, 0) represents the current temperature of temperature detecting and controlling integration device C is 20° C. and when time is 0 second, the power amplification $A_p$ is 0. The value of $A_p$ (20, 0) is the initial setting value of the power amplification for the power amplifier 3. Subsequently, the outputted compensation gain ΔG is adjusted in real time by the non-linear temperature-controlling unit 13 according to the current temperature T of the temperature detecting and controlling integration device C. Thus, the power amplification $A_p$ is dynamically adjusted at different times and under different temperatures, and the audio signal amplitude is outputted by the power amplifier 3 can be suppressed.

Next, the non-linear temperature-controlling unit 13 dynamically adjusts the compensation gain ΔG is described as following. The non-linear temperature-controlling unit 13 receives the temperature signal from the arithmetic unit 12 and performs an operation of the following formula (3) according to the temperature signal to obtain the compensation gain ΔG, the formula (3) is shown as following:

$$\Delta G(T, t) = -A \cdot (T - T_0) - B \cdot \left(\frac{\Delta T}{\Delta t}\right)^a \qquad (3)$$

wherein A and B represent coefficient respectively, the unit of A is decibels (dB) divided by temperature (degree Celsius, ° C.), it can be referred to dB/° C., the unit of B is time (second) multiplied decibels (dB and divided by temperature (degree Celsius, ° C.) and it can be referred to sec*dB/° C. T represents the current temperature of the temperature detecting and controlling integration device C, the unit of T is degree Celsius, ° C. $T_0$ is the comparison reference temperature, which is provided by the manufacture of the micro speaker 5. $T_0$ means that the temperature detecting and controlling integration device C can tolerate the highest rated temperature which is subtracted by 20° C. $T_0$ will be changed with the type of the micro speaker 5 and will be set by the user's requirement. The unit of $T_0$ is degree Celsius, ° C., ΔT/Δt represents the temperature change rate, the unit is temperature (degree Celsius, ° C.) divided by time (second), and it can be shown as ° C./sec. ΔT can be represents as ΔT=T−$T_1$, and Δt can be represents as Δt=t−$t_1$, t represents the time when the temperature detecting and controlling integration device C detecting the current temperature T, $t_1$ represents the any time before the time t, $T_1$ represents the temperature that is detected by the temperature detecting, and controlling integration device C at time $t_1$. In this embodiment of the present invention, Δt can be a time value in the range of 0.1 seconds to 10 seconds. Therefore, when Δt is adjusted which means that the sampling interval time of the temperature change rate is to be adjusted, such that the prediction time of the compensation gain ΔG can be diminished, so as to the temperature is quickly suppressed to the rated temperature range. The preferred value of Δt is 1 second. In addition, in the formula (3), the symbol a represents power term and is a positive number without units, which is determined the types of the micro speaker 5.

Moreover, the coefficient A, the coefficient B, the power term a, and the comparison reference temperature $T_0$ in the formula (3) are all set in the arithmetic unit 12. The current temperature T of the temperature detecting and controlling integration device 5 is performed a calculation by the arithmetic unit 12, and is contained in the temperature signal. Next, the non-linear temperature-controlling unit 13 calculates the temperature change rates $\Delta T/\Delta t$ according to above formula (3) to obtain a compensation gain $\Delta G$, after the temperature signal is transmitted into the non-linear temperature-controlling unit 13. Then, the power amplifier 3 received the compensation gain $\Delta G$, which is transmitted by the non-linear temperature-controlling unit 13 to control the output signal of the third node N3 at the next time.

Figure 4:
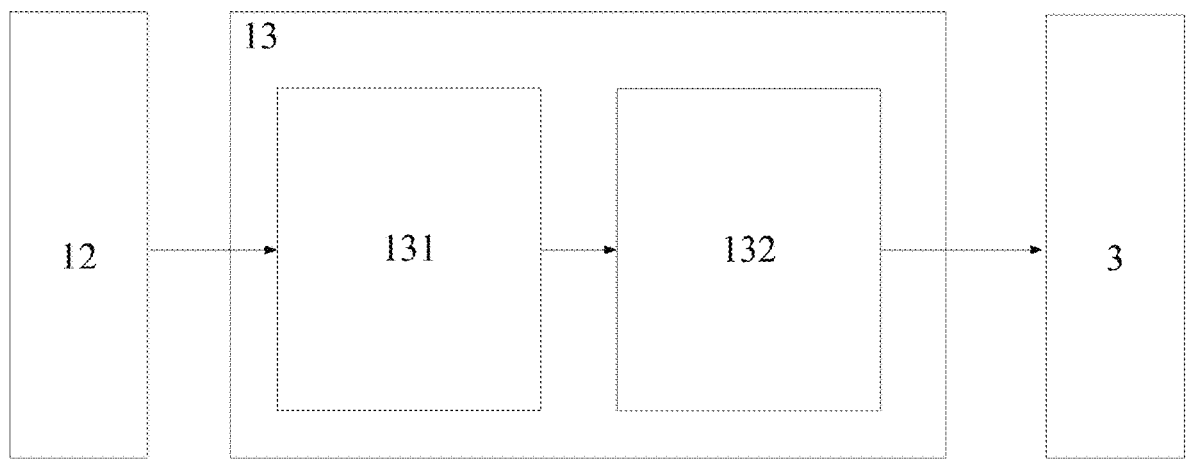
FIG. 4 is a circuit block diagram of a non-linear temperature-controlling unit of a temperature detecting and controlling integration device in accordance with the present invention.

FIG. 4 is a circuit block diagram of a non-linear temperature-controlling unit of a temperature detecting and controlling integration device. As shown in FIG. 4, the non-linear temperature-controlling unit 13 includes a data storage module 131 and a data conversion module 132. The data storage module 131 is used for receiving and storing the value of the power term a, a current temperature T, a comparison reference temperature $T_0$, a coefficient A and a coefficient B. The data conversion module 132 will access the data from the data storage module 131 to calculate the temperature change rates $\Delta T/\Delta t$ to obtain the compensation gain $\Delta G$ according to formula (3) when the data conversion module 132 performs an operation. Accordingly, the compensation gain $\Delta G$ is used for driving the power amplifier 3. In this invention, the data storage module 131 may be SRAM, DRAM, or flash memory, but it is not limited herein.

Please return to FIG. 2. It should be noted that an analog to digital converter (ADC) further arranged in front of the current filter 8 and the voltage filter 9, in which the analog to digital converters includes the analog-to-digital converters 6, 7. The analog-to-digital converters 6, 7 convert the analog type of coil thermal voltage signal and the extracted signal into the digital type of the extracted signal and the coil thermal voltage signal. The analog-to-digital converters 6, 7 are used for simplifying the operation process of the arithmetic unit 12 and converting the extracted signal and the coil thermal voltage signal into the readable format for the current filter 8 and the voltage filter 9.

Figure 3:
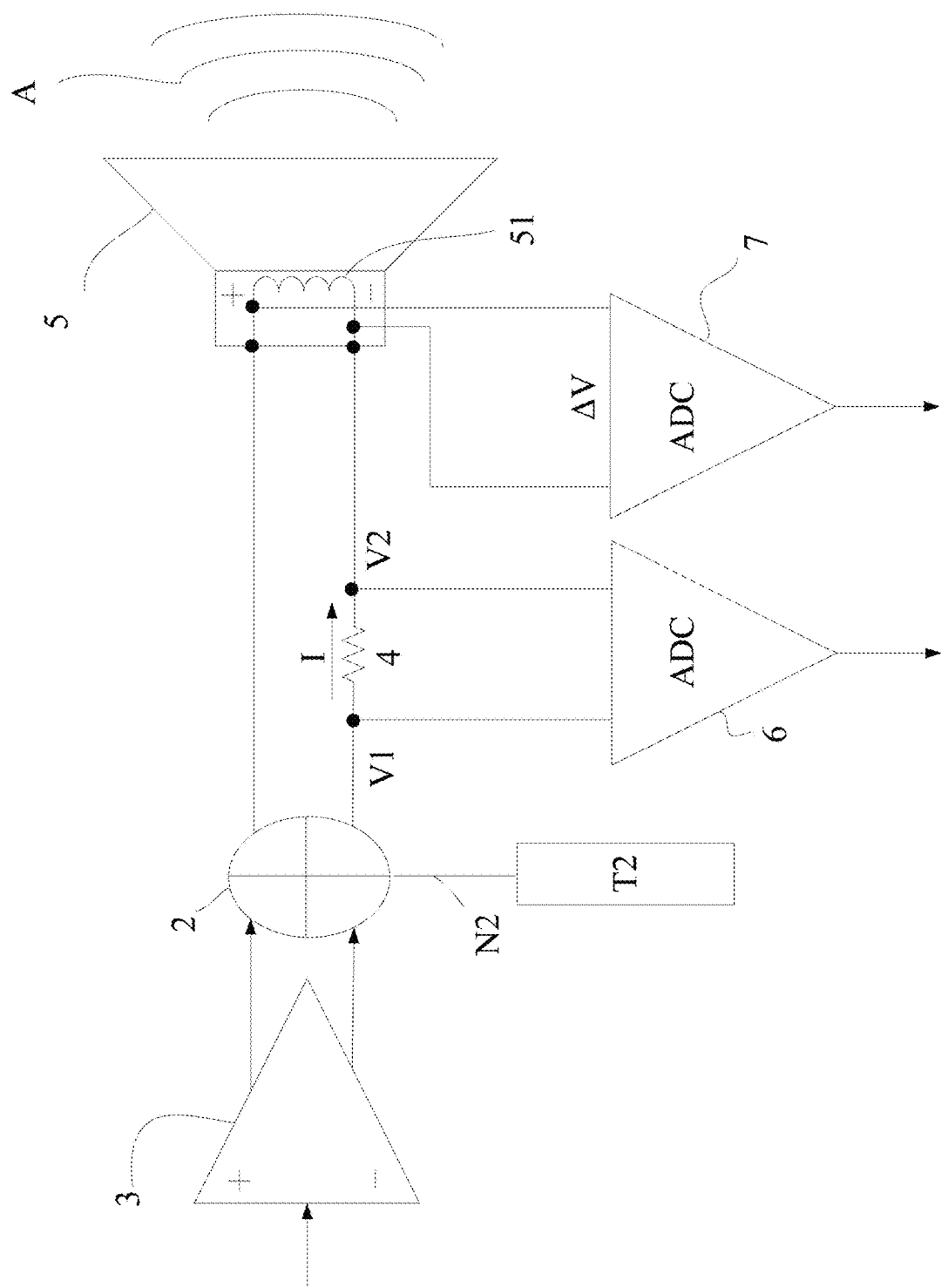
FIG. 3 is a circuit block diagram of driving and extracting signal of a temperature detecting and controlling integration device in accordance with the present invention.

Please refer FIG. 2 and FIG. 3. FIG. 3 is a circuit block diagram of driving and extracting signal of a temperature detecting and controlling integration device of another embodiment of the present invention. FIG. 3 shows the signal transmission between the power amplifier 3, the adder 2, the extraction resistor 4, the micro speaker 5 and the analog-to-digital converter 6, 7 of FIG. 2 in more detail. As shown in FIG. 3, the output terminal of the power amplifier 3 includes two ports. Thus, the power amplifier 3 is a double-ended output power amplifier 3. The input terminal and the output terminal of the adder 2 respectively include two ports for receiving an audio signal and outputting the adding signal. One of the output terminals of the adder 3 is coupled with the micro speaker 5 another output terminals of the adder 3 is coupled with the micro speaker 5 through the extraction resistor 4. The micro speaker 5 receives the adding signal that outputted from the adder 3. The micro speaker 5 operates to emit a sound signal K and generates a coil thermal voltage signal at the same time. The two ports of the input terminal of the analog-to-digital converter 6 are coupled to the two ends of the extraction resistor 4 respectively for capturing the current components in the extracted signal. The operation principle of the extraction resistor is that the two ends of the analog-to-digital converter 6 capture the voltages V1, V2 at two ends of the extraction resistor 4. Then, the extraction resistor 4 subtracts voltage V2 and voltage V1 to obtain the difference. Finally, the difference value of V2 and V1 is divided by the resistance value of the extraction resistor 4 so as to the current component in the extracted signal at a specific time can be obtained. The two input terminals of the analog-to-digital converter 7 are coupled with the two ends (such as a positive end and a negative end) of the big coil 51 of the micro speaker 5 respectively for capturing the voltages at two ends of the big coil 51 of the micro speaker 5 at a specific time, in which the voltages can be regards as the coil thermal voltage signal. Then, the analog-to digital converter 7 subtracts the voltages at two ends to obtain a voltage differences and is outputted to the post end. Thus, the analog-to-digital converters 6, 7 have a function similar to a triple-use meter, which allows the user to read the voltage and the current values.

Figure 5:
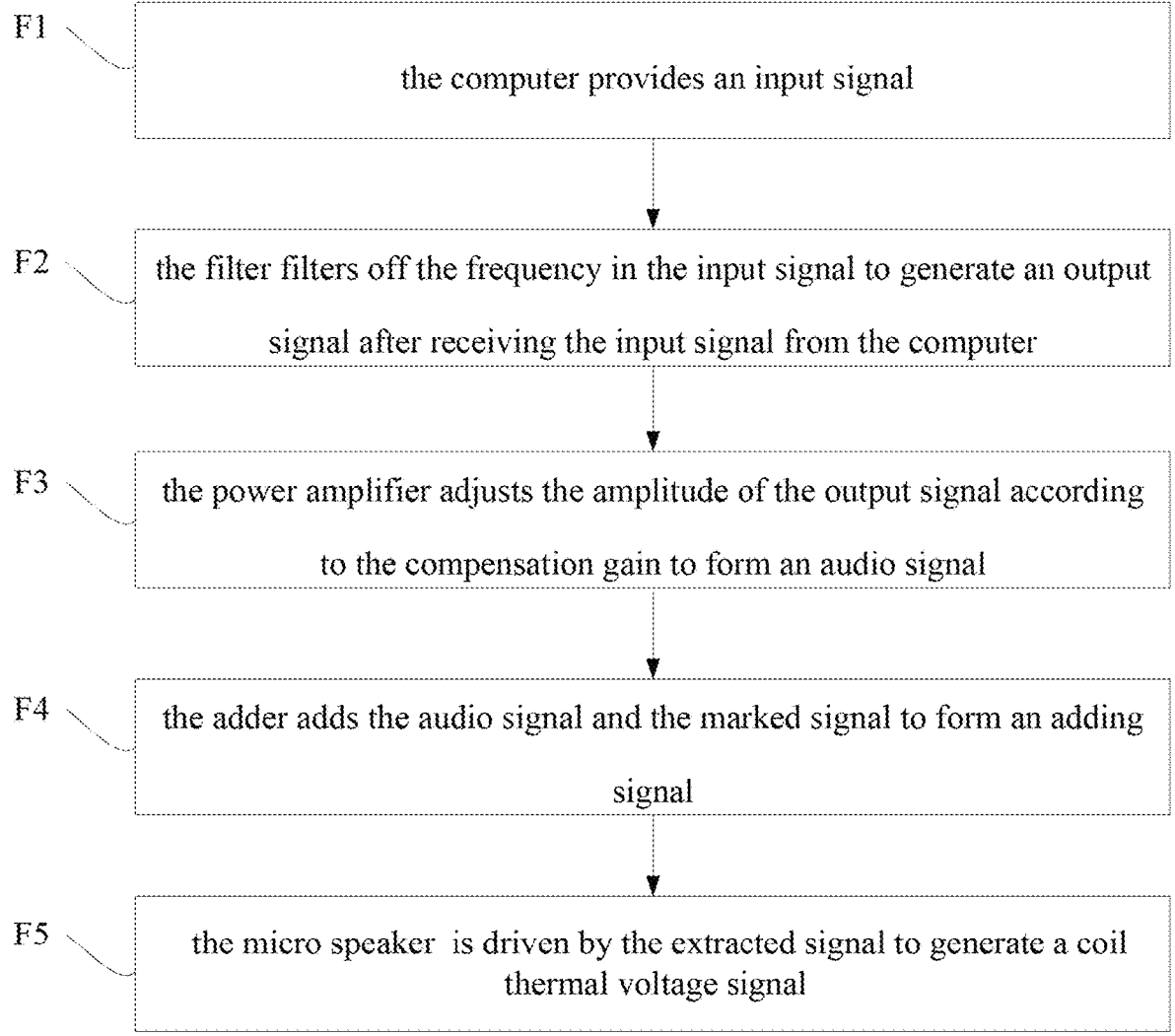
FIG. 5 is a flow chart of pre-processing of an analog-to-digital converter of a temperature detecting and controlling integration device in accordance with the present invention.

Next, the present invention provides a method for detecting the coil temperature in the micro speaker. Please return to FIG. 2. For the convenience of presentation, the processing flow for the micro speaker 5 is separated into a pre-processing flow and a post-processing flow. The pre-processing flow refers to the temperature detecting and controlling integration device to receive the external input signal to play the sound. The post-processing flow refers to the temperature detecting and controlling integration device to receive the signal from the micro speaker 5 and the external device T3 to display the temperature. In simple terms, the distinction used the analog-to-digital converters 6, 7 as the basic to distinguish the pre-components and the post-components. The components in front of the analog-to-digital converters 6, 7 refer to pre-components. The component in rear of the analog-to-digital converters 6, 7, refers to post-components, such as analog-to-digital converters 6, 7, and the non-linear temperature-controlling unit 13. The more detail pre-processing flow refer to FIG. 5. FIG. 5 is a pre-processing flow chart of the temperature detecting and controlling integration device C. The step F1 to step F5 in FIG. 2 are described in detail below, and please refer to FIG. 5.

Step F1: the computer T1 provides an input signal. The temperature detecting and controlling integration device C is electrically connected to the computer T1 through the wires, buses, jumpers, or wirings on the printed circuit board (PCB). The standards for connection between the temperature detecting and controlling integration device C and the computer T1 may be by the way of USB, SATA, SATA2, or via solder joints. After connecting, the temperature detecting and controlling integration device C receives the input signal from the computer T1.

Step F2: the filter 1 filters off the frequency in the input signal to generate an output signal after receiving the input signal from the computer T1. The received input signal includes various frequencies. In the time of the signal transmission, the noise is easily incorporated into the input signal. Such noises are mostly in the low frequency. To filter off the noises, a filter 1 is set at the input terminal to filter off the first frequency in the input signal. The range of the first frequency is above 0 Hz, and not more than 50 Hz.

Step F3: the power amplifier 3 adjusts the amplitude of the output signal according to the compensation gain to form an audio signal. After the power amplifier 3 receiving the output signal, the non-linear temperature-controlling unit 13 controls the power amplification $A_p$ of the power amplifier 3 to adjust the amplitude of the audio signal in real time, such that the sound signal K is outputted smoothly.

Step F4: the adder 2 adds the audio signal and the marked signal to form an adding signal, in which the marked signal is generated by a specific waveform generator T2. The marked signal is a signal frequency or multi-frequencies composite signals which is less than 50 Hz. The marked signal is to enable the extraction of the voltage signal and the current signal is more accurately, and to allow other components in the back-end to verify the accuracy of the signal extraction.

Step F5: the micro speaker 5 is driven by the extracted signal to generate a coil thermal voltage signal. At this time, the micro speaker 5 is performed to emit the sound signal. At the same time, when the sound signal K is emitted, the conversion efficiency of electric energy and kinetic energy is not achieved 100%, the electric energy is dissipated from the coil in the form of thermal energy. Due to the thermoelectric effect, both the micro speaker coil current and the voltage signal are changed, and then are captured by the analog-to-digital converter. After step F5 finished, the pre-processing flow can be completed at the pre-processing flow or the process is connected to other processes. If the pre-processing flow is finished, the temperature detecting and controlling integration device C includes a control function, that is, a function of driving the micro speaker 5 to emit a sound.

Figure 6:
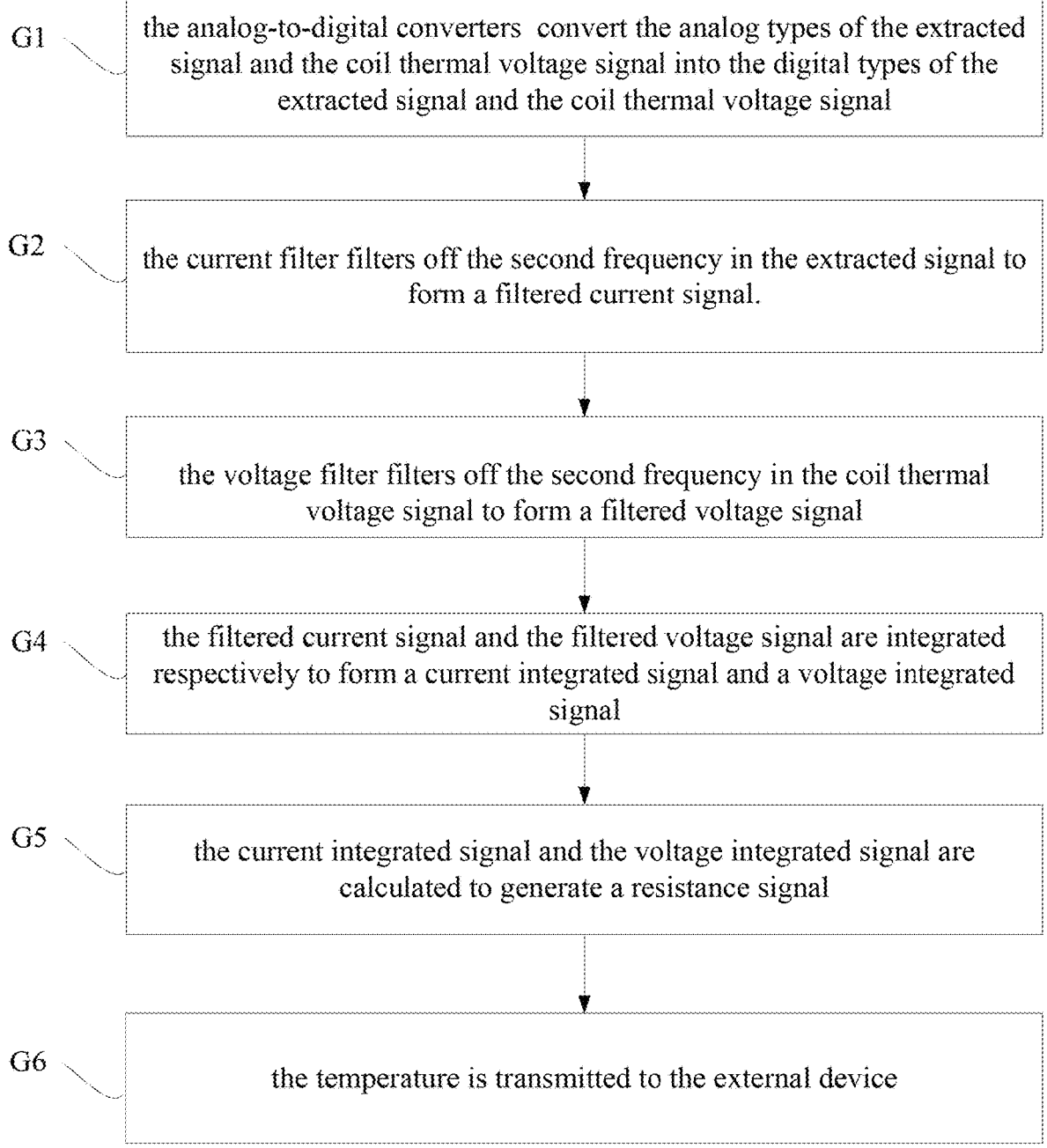
FIG. 6 is a flow chart of post-processing of an analog-to-digital converter of a temperature detecting and controlling integration device in accordance with the present invention.

Please refer to FIG. 6. FIG. 6 is a post-processing flow chart of the temperature detecting and controlling integration device C. The step G1 to step G5 in FIG. 6 are described in detail below, and please refer to FIG. 2.

Step G1: the analog-to-digital converters 6, 7 convert the analog types of the extracted signal and the coil thermal voltage signal into the digital types of the extracted signal and the coil thermal voltage signal. Since the analog signal is only readable by the micro speaker 5, for the convenience for facilitating the signal processing, the signal is converted to which is readable by the subsequent device, the analog-to-digital converters 6, 7 converts the analog types of the extracted signal and the coil thermal voltage signal into the digital types of the extracted signal and the coil thermal voltage signal. The analog type of the signal, for example, an arbitrary natural number signal with a physical quantity of 0 volt, 1 volts, 2 volts, or 3 volts, but the digital signal is composed of only a combination of natural numbers 0 and 1, such as signal. A sigital is a binary signal such as 0011 or 1100.

Step G2: the current filter 8 filters off the second frequency in the extracted signal to form a filtered current signal. The second frequency is in the range between 50 Hz-20,000 Hz. The purpose of the current filter 8 extracts a certain frequency range of the extracted signal is to obtain the thermal current signal.

Step G3: the voltage filter 9 filters off the second frequency in the coil thermal voltage signal to form a filtered voltage signal. The second frequency is in the range between 50 Hz-20,000 Hz. The purposes of the voltage filter 9 extracts a certain frequency range of the extracted signal is to obtain the thermal voltage signal. In the embodiment of the present invention, after step G3 is completed, and then the step G4 is performed. In another embodiment, step G2 and step G3 are performed simultaneously.

Step G4: the filtered current signal and the filtered voltage signal are integrated respectively to form a current integrated signal and a voltage integrated signal. The current integrated signal is obtained by, for example, integrating the filtered current signal, and the voltage integrated signal is obtained by integrating the filtered voltage signal. The integral operation uses a current integrator 10 and a voltage integrator 11. The range of the integration can be selected from 1 second to 10 seconds, and the range of the integration is not limited herein.

Step G5: the current integrated signal and the voltage integrated signal are calculated to generate a resistance signal. The temperature signal is generated after processing the resistance signal. The above-described operation is a division operation obtained by a divider (not shown in FIG. 2) in the arithmetic unit 12. It should be noted that the arithmetic unit 12 divides the current integrated signal and the voltage integrated signal that are obtained at the same time to obtain a resistance signal. The resistance signal is calculated according to above formula (1), the steps of the calculation is not repeated herein.

Step G6: the temperature is transmitted to the external device T3. The external device T3 is usually an electric thermometer or a smart phone. The temperature detecting and controlling integration device C is connected to the external device T3 via wires or jumpers, for example, by USB or printed circuit board wiring. After step G6 is completed, the subsequent post-processing may be completed, or other processes may be followed. If the post-processing is finished, the temperature detecting and controlling integration device C capable of a function of detecting temperature, that is, the temperature detecting and controlling integration device C capable of a function of detecting the coil temperature in the micro speaker 5.

Figure 7:
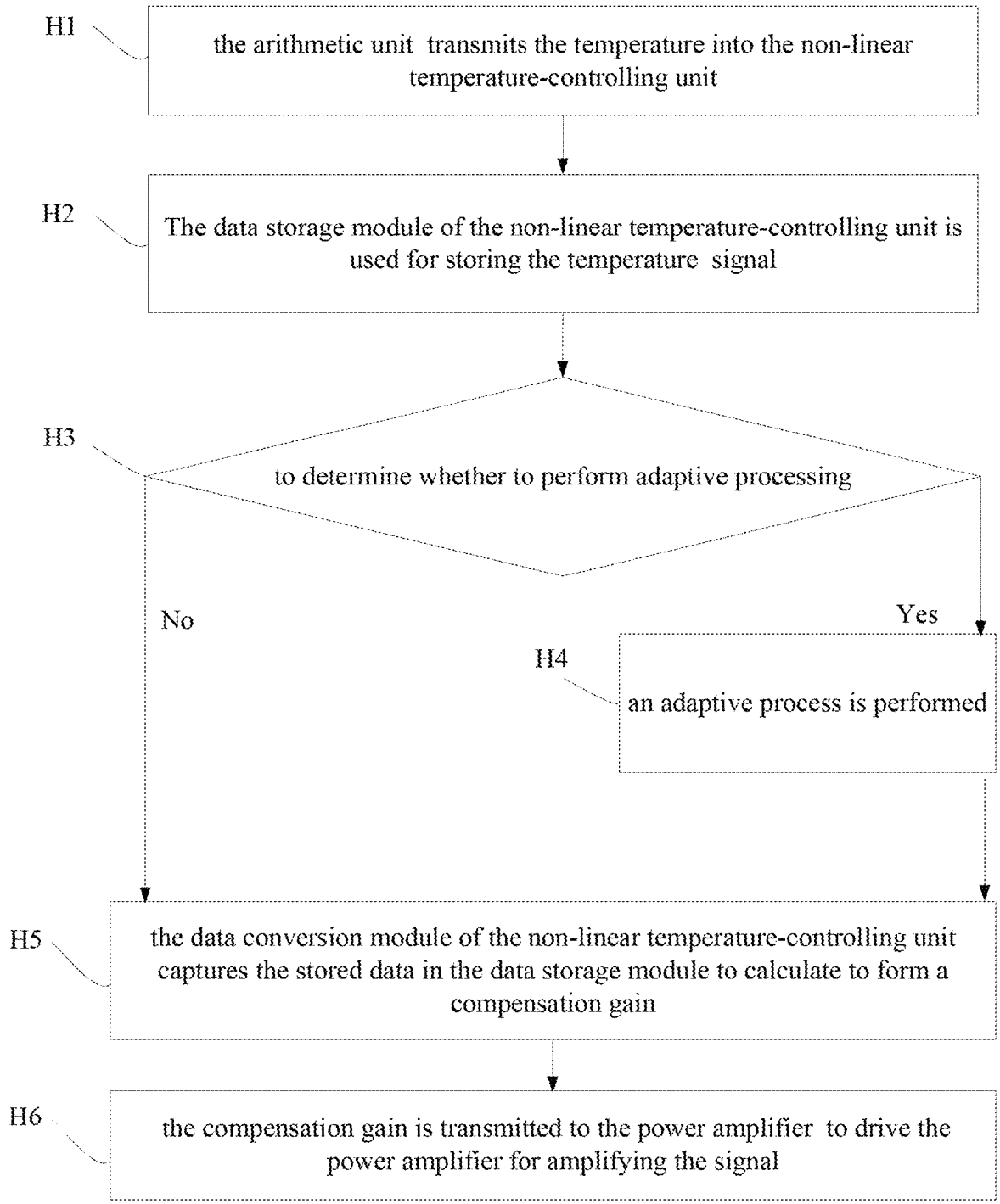
FIG. 7 is a processing flow chart of an adjustment mode in accordance with the present invention.

The following describes the temperature control method of the present invention. Please refer to FIG. 2, FIG. 4 and FIG. 7, and FIG. 7 is a flow chart of an adjustment mode. The details of the process of the adjustment mode are described below, including steps H1 to H6.

Step H1: the arithmetic unit 12 transmits the temperature into the non-linear temperature-controlling unit 13, in which the temperature signal includes a coefficient A, a coefficient B, the current temperature T and a comparison reference temperature $T_0$.

Step H2: the data storage module 131 of the non-linear temperature-controlling unit 13 is used for storing the temperature signal. The temperature signal can be permanently stored by temporarily resisted in the data storage module 131.

Figure 8A:
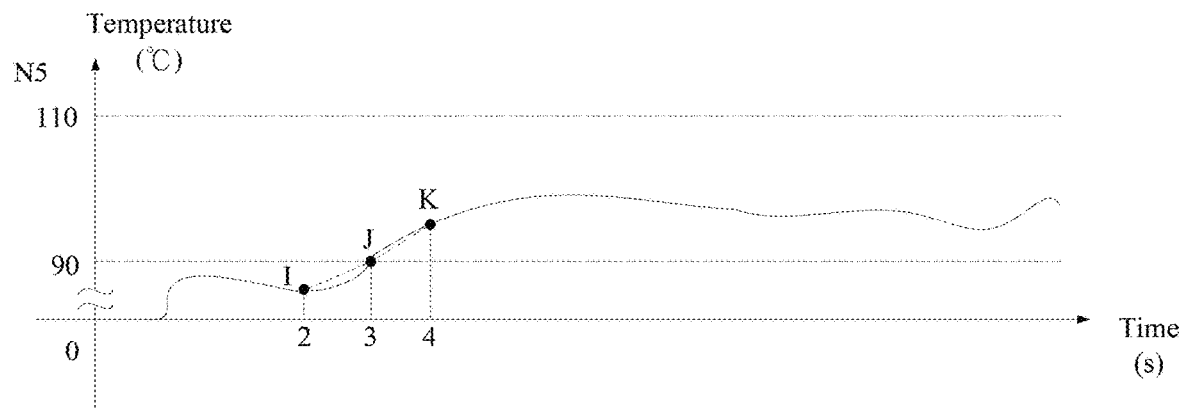
FIG. 8a~FIG. 8c is a waveform diagram of a fifth node N5, a second node N2 and a third node N3 during the adaptive processing is performed in accordance with the present invention.
Figure 8B:
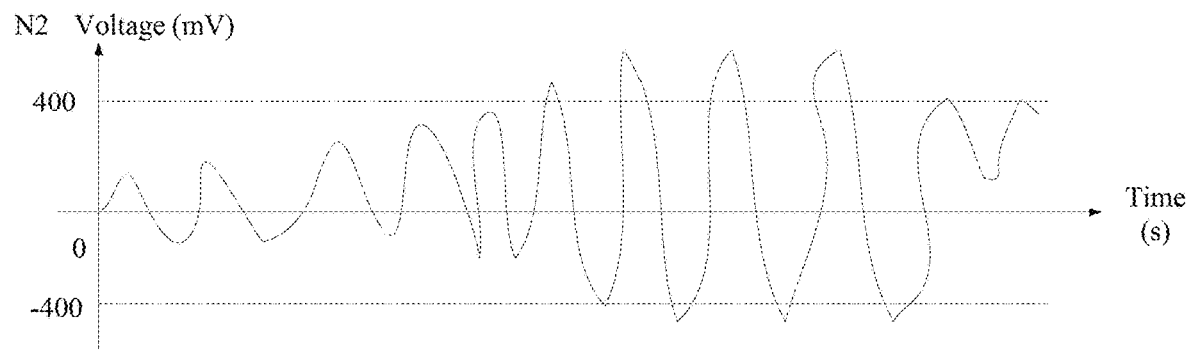
Figure 8C:
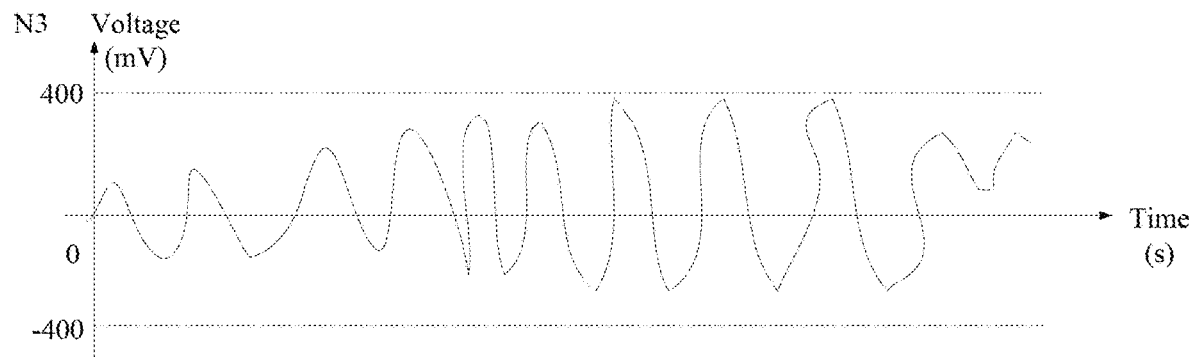

Step H3: to determine whether to perform adaptive processing, if it is, to perform step H4, else, to perform step H5. The detailed determination steps are described in detail as following. Please refer to FIG. 8a~FIG. 8c. FIG. 8a~FIG. 8c shows the waveform diagrams of fifth node N5, the second node N2, and the third node N3 when the adaptive processing is performed. The determination is processed by the data storage module 131 of the non-linear temperature-controlling device 13. As shown in FIG. 8a, when the arithmetic unit 12 emits the temperature signal to the non-linear temperature-controlling device 13, the data storage module 131 will determine whether the current temperature T of the temperature signal (the signal of the fifth node N5) is within the rated temperature range. If the current temperature T is not within the rated temperature range, the data storage module 131 directly passes the data to the data conversion module 132, that is, step H5 is to be performed. If the current temperature T is within the rated temperature range, as shown in FIG. 8a, the current temperature T falls just below the lower limit of the rated temperature at the third second, and at this time, the data storage module 131 will perform adaptive processing, that is, step H4 is to be performed. In the present invention, the current temperature T of the temperature detecting and controlling integration device C is an unstable value which is changed with the time, and the frequency of data acquisition by the data storage module 131 is once every second. If the current temperature T jumps to the rated temperature, the adaptive processing will start immediately.

Step H4: an adaptive process is performed. The adaptive process is that the operation is performed to generate a temperature change rate $\Delta T/\Delta t$. The principle of detailed adaptive process is described in FIG. 8a. When the current temperature T is 3 seconds, the data conversion module 132 automatically locates I point, in which I point is the temperature T1 at time t1 is 2 seconds, the data conversion module 132 calculates the temperature change rate $\Delta T/\Delta t$ from the data of I point and J point.

Step H5: the data conversion module 132 of the non-linear temperature-controlling unit 13 captures the stored data in the data storage module 131 to calculate to form a compensation gain $\Delta G$. In this embodiment, the data conversion module 132 will capture the coefficient A, the coefficient B, the power term a, the current temperature T, the compensation reference temperature T0, and the temperature change rate ($\Delta T/\Delta t$) and calculates according to above formula (3) to obtain the compensation gain $\Delta G$.

Step H6: the compensation gain $\Delta G$ is transmitted to the power amplifier 3 to drive the power amplifier 3 for amplifying the signal. At this time, the power amplifier 3 utilizes is pre-programmed and is stored in the data storage module 131. The contents of the look-up table are shown in table 1, in which the table 1 shows the different values of the compensation gain $\Delta G$ for different temperature T and temperature change rate ($\Delta T/\Delta t$). Please refer to table 1, the horizontal columns show the different value of the temperature change rate ($\Delta T/\Delta t$), and the vertical columns show the different current temperature T value. The table content shows the compensation gain $\Delta G$ at a specific temperature change rate ($\Delta T/\Delta t$) and the compensation gain $\Delta G$ at the specific temperature T. the combination of the different current temperature T and the temperature change rate ($\Delta T/\Delta t$) also represents that the compensation gain $\Delta G$ exists at a different address of the data storage module 131. The data conversion module 132 looks up the correlation value stored in the table in the data storage module 131 according to the received current temperature T and the temperature change rate ($\Delta T/\Delta t$), and performs the look-up table process to find out a specific compensation gain $\Delta G$. For example, the data conversion module 132 receives a temperature change rate ($\Delta T/\Delta t$) is 4 and the current temperature T is 105, the compensation gain $\Delta G$ is −12. Then, the data conversion module 132 transmits the compensation gain $\Delta G$ ($\Delta G$ is −12) to the power amplifier 3. Step J4 will be performed after step J3 is completed.

TABLE 1

| T (° C.) | $\Delta T/\Delta t$ (° C./S) | | | | | | | | | |
|---|---|---|---|---|---|---|---|---|---|---|
| | 2 | 4 | 6 | 8 | 10 | 12 | 14 | 16 | 18 | 20 |
| 110 | −15 | −16 | −17 | −18 | −20 | −21 | −23 | −25 | −27 | −30 |
| 105 | −11 | −12 | −13 | −14 | −17 | −18 | −19 | −21 | −24 | −26 |
| 100 | −8 | −9 | −10 | −11 | −14 | −15 | −16 | −18 | −21 | −22 |
| 95 | −5 | −6 | −7 | −8 | −12 | −13 | −14 | −15 | −18 | −19 |
| 90 | −3 | −4 | −5 | −6 | −10 | −11 | −12 | −13 | −15 | −16 |
| 85 | −2 | −3 | −4 | −5 | −8 | −9 | −10 | −11 | −12 | −13 |
| 80 | −1 | −2 | −3 | −4 | −6 | −7 | −8 | −9 | −10 | −11 |
| 75 | −0.5 | −1 | −2 | −3 | −4 | −5 | −6 | −7 | −8 | −9 |
| 70 | 0 | −0.5 | −1 | −2 | −3 | −4 | −5 | −6 | −7 | −8 |
| 65 | 0 | 0 | −0.5 | −1 | −2 | −3 | −4 | −5 | −6 | −7 |
| 60 | 0 | 0 | 0 | −0.5 | −1 | −2 | −3 | −4 | −5 | −6 | the compensation gain $\Delta G$ at t=4 to obtain a new power amplification $A_p$ according to above formula (2). In addition, the power amplifier 3 utilizes $A_p$ to amplify the output signal from the filter 1. After the step H6 is completed, the adjustment mode process is finished, or other processes may be performed subsequently. If the adjustment mode is finished, the temperature detecting and controlling integration device C includes a function of adjusting the power amplification rate of the power amplifier 3.

Figure 9:
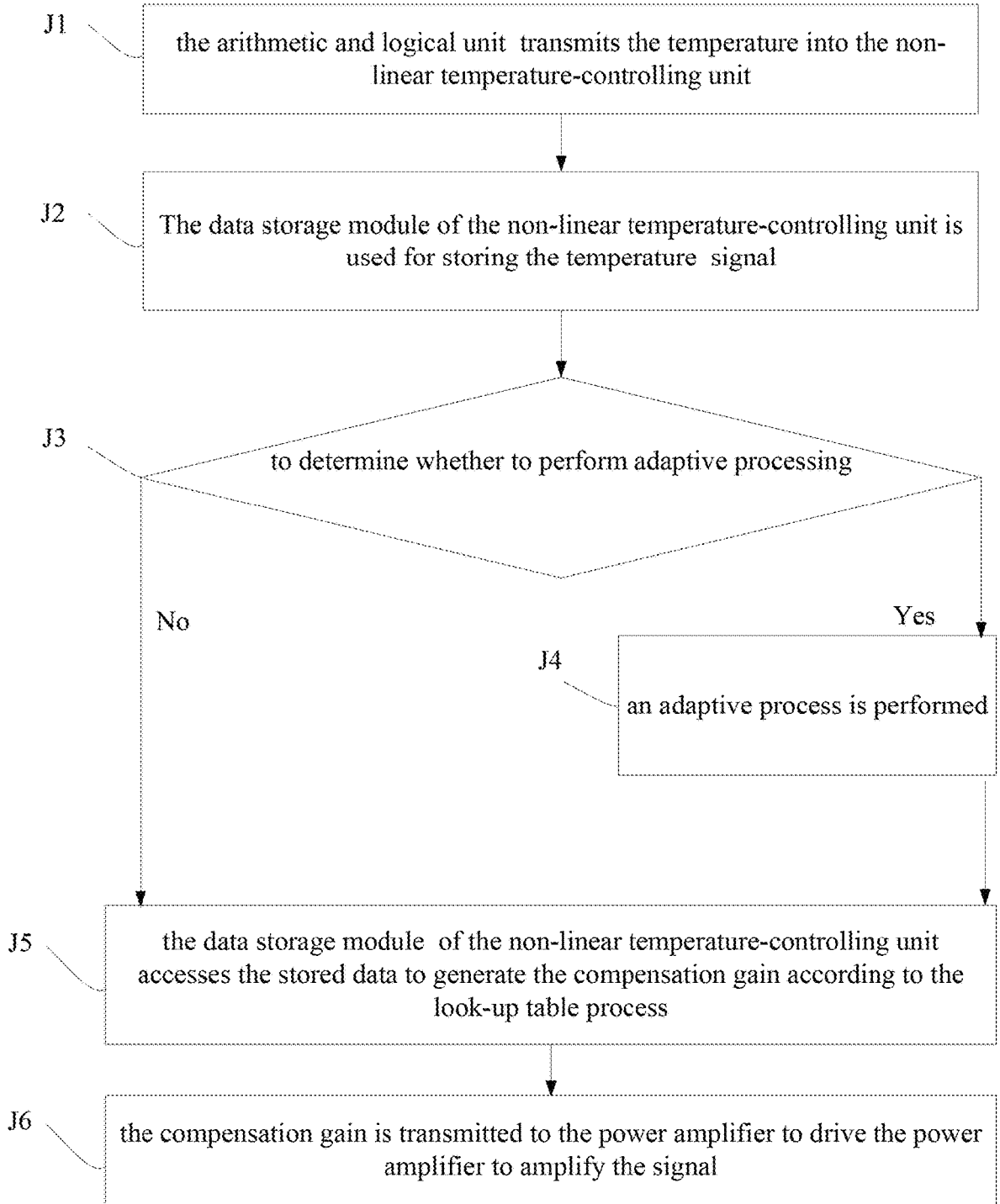
FIG. 9 is a flow chat of a look-up table in a temperature detecting and controlling device in accordance with the present invention.

Finally, another embodiment of the temperature controlling method is disclosed. Please refer to FIG. 9. FIG. 9 is a flow chat of a look-up table in a temperature detecting and controlling device. The look-up table process is described in detail as following. The look-up table process includes step J1 to step J6. Since the contents of step J1, step J4 and step J6 are the same as above step H1 and the step H4 and the step H6, which has been described as aforementioned. Accordingly, it is not to be described herein. It is mainly illustrated for step J5. Step J5 utilizes the data storage module 131 of the non-linear temperature-controlling unit 13 to store the temperature signal, in which the temperature signal, for example, a coefficient A, a coefficient B, a power term a, a current temperature T, and a compassion reference temperature $T_0$. Furthermore, in this mode, a look-up table After step J6 is completed, the look-up table process is also finished, or other process may be performed subsequently. If in the adjustment mode process, the temperature detecting and controlling integration device C includes a function of adjusting the power amplification of the power amplifier 3.

The non-linear temperature-controlling unit 13 of the present invention further includes a switch module (not shown in FIG. 4). The user can automatically switch the desired mode, including the adjustment mode and look-up table mode, so that the compensation gain $\Delta G$ can be quickly obtained. In this embodiment of the present invention, the switch module is usually a switching circuit.

In the temperature controlling method of the present invention, by using the adaptive processing and the look-up table process to enable the temperature control of the micro speaker and to play the sound signal K smoothly. The non-linear temperature-controlling unit 13 makes a prediction on the future coil temperature based on the current temperature T, and then sends a control command to the power amplifier 3 to change the played amplitude of the audio signal and maintain the temperature within the temperature rated range.

What is claimed is:

1. A method for controlling a coil temperature of a micro speaker, comprising:
   transmitting a temperature signal into a non-linear temperature-controlling unit;
   storing a temperature signal and a table by a data storage module of the non-linear temperature-controlling unit;
   determining whether a current temperature of the temperature signal is within a rated temperature range, if it is, an adaptive process is performed;
   generating a temperature change rate with the adaptive process;
   capturing the temperature signal and the temperature change rate to calculate a compensation gain; and
   transmitting the compensation gain to a power amplifier to obtain a new power amplification;
   wherein the compensation gain is calculated by the formula as:

$$\Delta G(T, t) = -A \cdot (T - T_0) - B \cdot \left(\frac{\Delta T}{\Delta t}\right)^a,$$

wherein A and B represent coefficient respectively, T represents the current temperature of the temperature detecting and controlling integration device C, $T_0$ is the comparison reference temperature, and $\Delta T/\Delta t$ represents the temperature change rate.

2. The method according to claim 1, further comprising a look-up table process which is provided for receiving the current temperature and the temperature change gain to find out a specific compensation gain.

3. The method according to claim 2, wherein the look-up table process further comprises the step of transmitting the specific compensation gain to the power amplifier.

4. The method according to claim 1, wherein the temperature signal is transmitted by an arithmetic unit.

5. The method according to claim 1, wherein the step of determining whether the current temperature of the temperature signal is within the rated temperature range, if it is not, capturing the stored data to calculate to form a compensation gain.

6. The method according to claim 1, wherein the temperature signal is a coefficient A, a coefficient B, a power term a, a current temperature T, or a comparison reference temperature.

7. The method according to claim 1, wherein a sampling frequency of the non-linear temperature-controlling unit is selected from the group consisting of any number of 0.1-10 seconds.

8. A temperature detecting and controlling integration device coupled with a computer which is used for controlling a coil temperature in a micro speaker, comprising:
   an arithmetic unit is provided for transmitting a temperature signal into a non-linear temperature-controlling unit;
   a data storage module of the non-linear temperature-controlling unit is provided for storing the temperature signal, wherein the temperature signal is stored in the data storage module and is provided for determining whether the current temperature of the temperature signal is within a rated temperature range;
   a data conversion module is provided for generating a temperature change rate and is provided for capturing the stored data to calculate to form a compensation gain; and
   a power amplifier is provided for receiving the compensation gain to drive the power amplifier for amplifying an output signal and to obtain a new power amplification with the compensation gain;
   wherein the compensation gain is calculated by the formula as:

$$\Delta G(T, t) = -A \cdot (T - T_0) - B \cdot \left(\frac{\Delta T}{\Delta t}\right)^a,$$

wherein A and B represent coefficient respectively, T represents the current temperature of the temperature detecting and controlling integration device C, $T_0$ is the comparison reference temperature, and $\Delta T/\Delta t$ represents the temperature change rate.

9. The temperature detecting and controlling integration device according to claim 8, wherein the temperatures signal includes a coefficient A, a coefficient B, a current temperature T, and a comparison reference temperature.

10. The temperature detecting and controlling integration device according to claim 8, wherein the data storage module is provided for storing a pre-programmed look-up table, wherein the pre-programmed look-up table shows the different values of the compensation gain for different temperature T and the temperature change rate.

11. The temperature detecting and controlling integration device according to claim 8, further comprising a switch module which is provided for automatically switching an adjustment mode and a look-up table mode.

12. The temperature detecting and controlling integration device according to claim 11, wherein the switch module is a switching circuit.

* * * * *